(12) United States Patent
Shin

(10) Patent No.: US 10,510,772 B2
(45) Date of Patent: Dec. 17, 2019

(54) SEMICONDUCTOR DEVICE AND METHOD OF MANUFACTURING THE SAME

(71) Applicant: SK hynix Inc., Icheon-si Gyeonggi-do (KR)

(72) Inventor: Wan Sup Shin, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/246,248

(22) Filed: Jan. 11, 2019

(65) Prior Publication Data

US 2019/0148405 A1 May 16, 2019

Related U.S. Application Data

(62) Division of application No. 15/200,279, filed on Jul. 1, 2016, now Pat. No. 10,217,760.

(30) Foreign Application Priority Data

Jan. 25, 2016 (KR) .......... 10-2016-0008814

(51) Int. Cl.
| | |
|---|---|
| H01L 27/11582 | (2017.01) |
| H01L 49/02 | (2006.01) |
| H01L 27/11578 | (2017.01) |
| H01L 21/02 | (2006.01) |
| H01L 29/423 | (2006.01) |

(52) U.S. Cl.
CPC .. *H01L 27/11582* (2013.01); *H01L 21/02238* (2013.01); *H01L 21/02247* (2013.01); *H01L 27/11578* (2013.01); *H01L 28/00* (2013.01); *H01L 29/42368* (2013.01)

(58) Field of Classification Search
CPC ................ H01L 27/11578; H01L 27/11568
See application file for complete search history.

(56) References Cited

U.S. PATENT DOCUMENTS

| 2010/0181610 A1 | 7/2010 | Kim et al. |
| 2011/0147823 A1 | 6/2011 | Kuk et al. |
| 2013/0270643 A1 | 10/2013 | Lee et al. |
| 2016/0043093 A1 | 2/2016 | Lee et al. |

FOREIGN PATENT DOCUMENTS

| KR | 1020110130916 A | 12/2011 |
| KR | 1020110132817 A | 12/2011 |

*Primary Examiner* — Matthew L Reames
*Assistant Examiner* — John A Bodnar
(74) *Attorney, Agent, or Firm* — William Park & Associates Ltd.

(57) ABSTRACT

In an embodiment, the semiconductor device may include interlayer insulating layers, conductive patterns, a channel layer, cell blocking insulating layers, dummy blocking insulating layers, and a data storage layer. The interlayer insulating layers and conductive patterns may be alternately stacked. The channel layer may pass through the interlayer insulating layers and the conductive patterns. The cell blocking insulating layers may be respectively arranged between the channel layer and the conductive patterns. The dummy blocking insulating layers may be respectively arranged between the channel layer and the interlayer insulating layers, and may protrude further toward a side wall of the channel layer than the cell blocking insulating layers. The data storage layer may surround the side wall of the channel layer, and may be formed on a concavo-convex structure defined by the cell blocking insulating layers and the dummy blocking insulating layers.

11 Claims, 9 Drawing Sheets

SEMICONDUCTOR DEVICE AND METHOD OF MANUFACTURING THE SAME

CROSS-REFERENCE TO RELATED APPLICATION

The present application is a divisional application for U.S. patent application Ser. No. 15/200,279, filed on Jul. 1, 2016, and claims priority under 35 U.S.C. § 119(a) to Korean patent application number 10-2016-0008814 filed on Jan. 25, 2016 in the Korean Intellectual Property Office, the entire disclosure of which is incorporated herein by reference.

BACKGROUND

1. Technical Field

Various embodiments of the present invention generally relate to a semiconductor device and a method of manufacturing the same, and more particularly to a three dimensional semiconductor memory device and a method of manufacturing the same.

2. Related Art

Semiconductor devices may be manufactured as integrated circuits. Examples of such integrated circuits may include a memory device capable of storing data. A memory device may include a memory array, which is where data bits are actually stored. For example, a memory cell array of a certain form of non-volatile memory device may include a plurality of memory cell strings. Each of the memory cell strings may include memory cells serially connected through a channel layer.

In order to highly integrate the semiconductor device, a three dimensional cell string structure having three-dimensionally arranged memory cells serially connected through the channel layer was suggested. In order to improve operational reliability of the semiconductor memory device having the three dimensional cell string structure, various structures and manufacturing methods are being developed.

SUMMARY

A semiconductor device according to an embodiment of the present invention may include interlayer insulating layers, conductive patterns, a channel layer, cell blocking insulating layers, dummy blocking insulating layers, and a data storage layer. The interlayer insulating layers and conductive patterns may be alternately stacked. The channel layer may pass through the interlayer insulating layers and the conductive patterns. The cell blocking insulating layers may be respectively arranged between the channel layer and the conductive patterns. The dummy blocking insulating layers may be respectively arranged between the channel layer and the interlayer insulating layers, and may protrude further toward a side wall of the channel layer than the cell blocking insulating layers. The data storage layer may surround the side wall of the channel layer, and may be formed on a concavo-convex structure defined by the cell blocking insulating layers and the dummy blocking insulating layers.

A semiconductor device according to an embodiment of the present invention may include a channel layer, a conductive pattern, a cell blocking insulating layer, and a data storage layer. The channel layer may include a first part and a second part alternately arranged in an extension direction of the channel layer. The conductive pattern may surround the second part. The cell blocking insulating layer may be arranged between the conductive pattern and the second part. The data storage layer may be arranged between the cell blocking insulating layer and the second part. The data storage layer may extend along an external wall of the channel layer, and may protrude toward the conductive pattern.

A method of manufacturing a semiconductor device according to an embodiment of the present invention may include alternately stacking first material layers and second material layers, forming a hole passing through the first material layers and the second material layers, forming cell blocking insulating layers arranged on side walls of the second material layers and dummy blocking insulating layers arranged on side walls of the first material layers, the cell blocking insulating layers having side walls protruding further toward the hole than the cell blocking insulating layers, and forming a data storage layer along the side walls of the cell blocking insulating layers and the dummy blocking insulating layers.

DETAILED DESCRIPTION

Figure 1A:
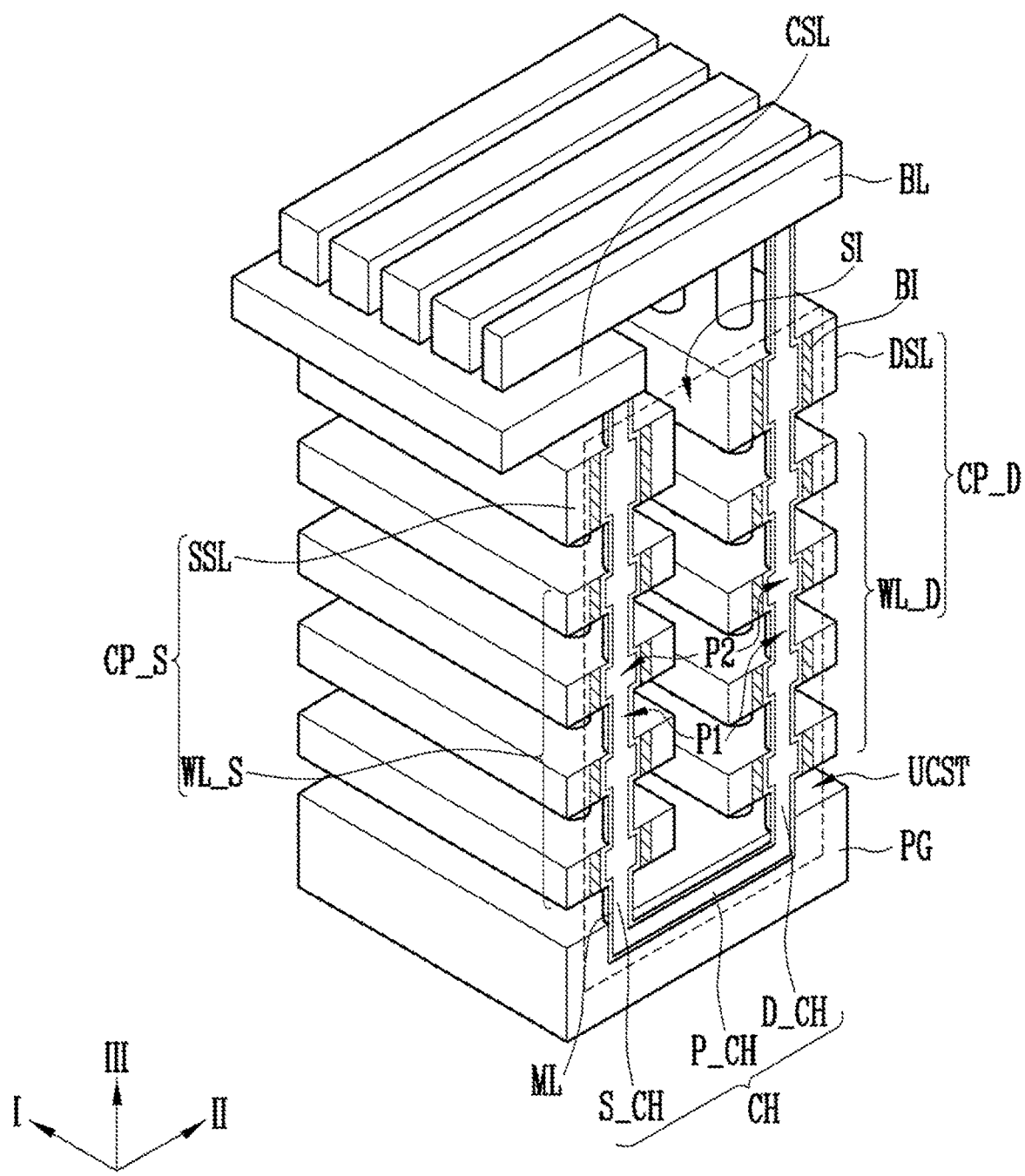
FIGS. 1A to 1C are perspective views illustrating examples of semiconductor devices according to embodiments of the present invention.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

An embodiment of the present invention relates to a semiconductor device capable of improving operation reliability of a three dimensional semiconductor memory device and a method of manufacturing the same.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

Figure 1B:
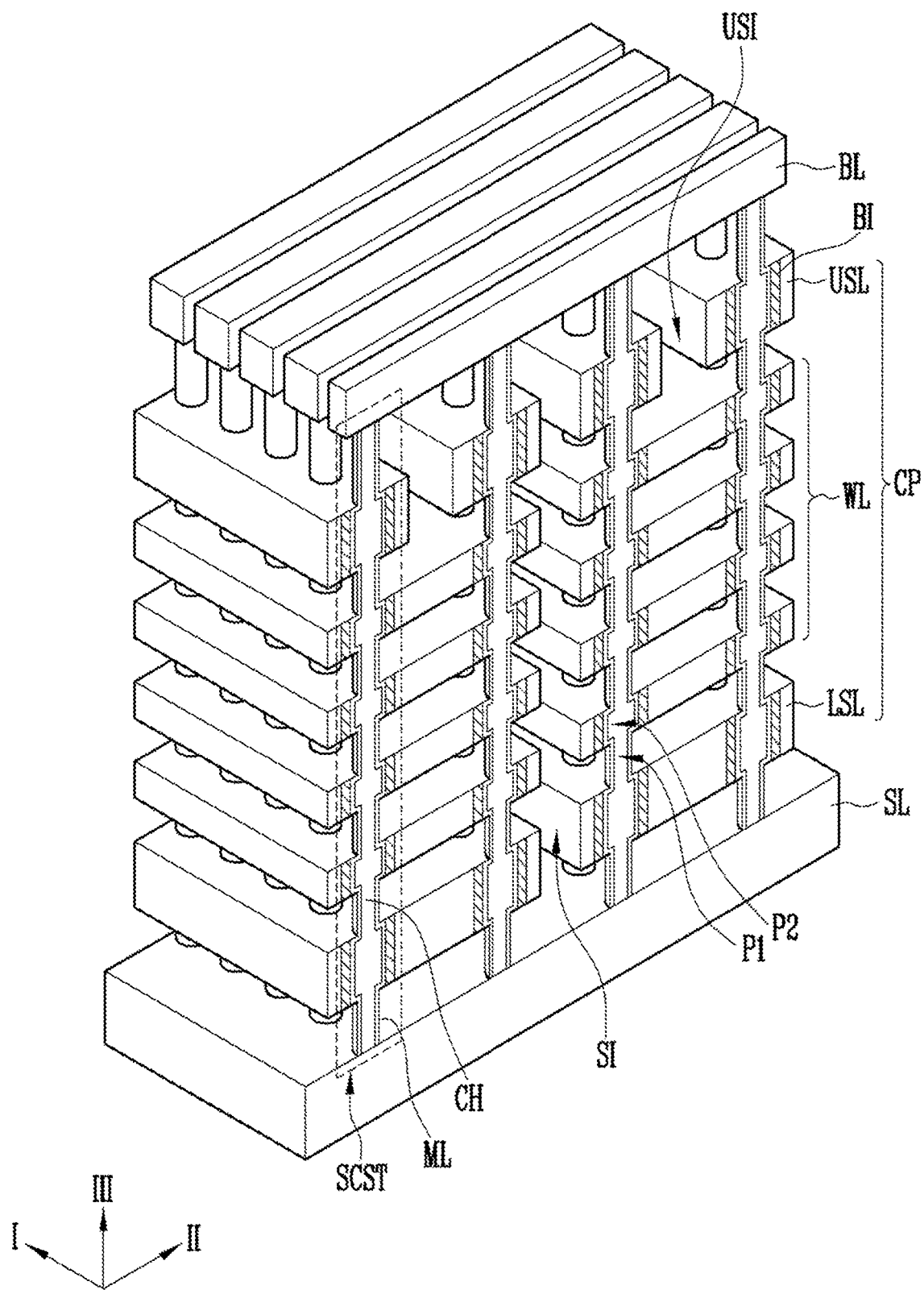
Figure 1C:
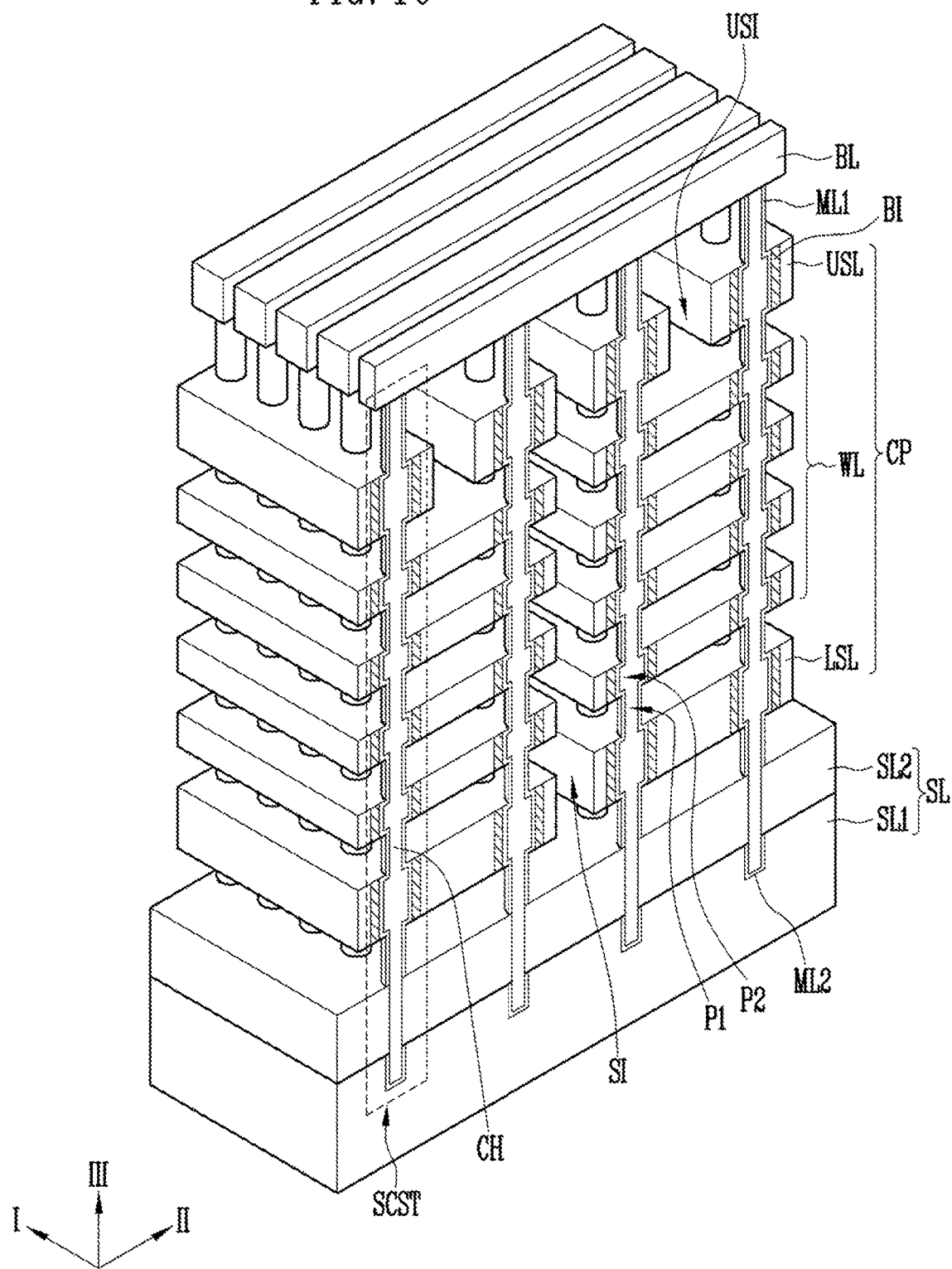

FIGS. 1A to 1C are perspective views illustrating examples of semiconductor devices according to some embodiments of the present invention. In FIGS. 1A to 1C, interlayer insulating layers are not illustrated.

Each of the semiconductor devices according to some embodiments of the present invention may include memory blocks formed in a memory cell array region, and each of the memory blocks may include a plurality of cell strings. Example structures of the cell strings may include a three dimensional structure that can allow progressive increases in density.

Referring to FIG. 1A, each of the memory blocks may include a U-type cell string UCST. The U-type cell string UCST may include a U-shaped channel layer CH, conductive patterns CP_S and CP_D separately stacked to surround the channel layer CH, and a pipe gate PG arranged under the conductive patterns CP_S and CP_D to surround the channel layer CH.

The channel layer CH may include a pipe channel layer P_CH buried in the pipe gate PG, and a source side channel layer S_CH and a drain side channel layer D_CH extending from the pipe channel layer P_CH. The channel layer CH may be a tube-shaped layer that surrounds a central region of a U-shaped hole filled with a core insulating layer. Alternatively, the channel layer CH may be formed by filling the central region of the U-shaped hole.

The channel layer CH may be electrically connected between a common source line CSL and a bit line BL. The bit line BL and the common source line CSL may be arranged in different layers separate from each other. For example, the common source line CSL may be arranged under the bit line BL. The bit line BL may be electrically connected to an upper end of the drain side channel layer D_CH. The bit line BL may extend in a second direction II, which intersects a first direction I. A contact plug may be formed between the bit line BL and the drain side channel layer D_CH. The common source line CSL may be electrically connected to an upper end of the source side channel layer S_CH. The contact plug may be formed between the common source line CSL and the source side channel layer S_CH.

The pipe gate PG may be arranged under the bit line BL, the common source line CSL, and the conductive patterns CP_S and CP_D to surround the pipe channel layer P_CH.

The conductive patterns CP_S and CP_D may include source side conductive patterns CP_S and drain side conductive patterns CP_D separated by a slit SI. Although not illustrated in the drawings, the conductive patterns CP_S and CP_D may be interleaved with interlayer insulation layers. The source side conductive patterns CP_S and the drain side conductive patterns CP_D may be arranged under the bit line BL and the common source line CSL.

The source side conductive patterns CP_S may include source side word lines WL_S and a source select line SSL that are sequentially stacked along the source side channel layer S_CH. The source side word lines WL_S may be arranged between the common source line CSL and the pipe gate PG. The source select line SSL may be arranged between the common source line CSL and the source side word lines WL_S. Here, a single source select line SSL may be arranged between the common source line CSL and the source side word lines WL_S. Alternatively, two or more source select lines SSL stacked between the common source line CSL and the source side word lines WL_S may be provided.

The drain side conductive patterns CP_D may include drain side word lines WL_D and a drain select line DSL sequentially stacked along the drain side channel layer D_CH. The drain side word lines WL_D may be arranged between the bit line BL and the pipe gate PG. The drain select line DSL may be arranged between the bit line BL and the drain side word lines WL_D. Here, a single drain select line DSL may be arranged between the bit line BL and the drain side word lines WL_D. Alternatively, one or more drain select lines DSL stacked between the bit line BL and the drain side word lines WL_D may be provided.

Each of the source side channel layer S_CH and the drain side channel layer D_CH may extend in the third direction III perpendicular to a plane that extends in the first direction I and the second direction II. Each of the source side channel layer S_CH and the drain side channel layer D_CH may have a concavo-convex structure. For example, each of the source side channel layer S_CH and the drain side channel layer D_CH may be thicker at regions on which the conductive patterns CP_S and CP_D are formed than other regions.

Each of the source side channel layer S_CH and the drain side channel layer D_CH may include first parts P1 and second parts P2 alternately arranged in the third direction III. Side walls of the second parts P2 may protrude further toward a center of the slit SI than side walls of the first part P1. As a result, a width of the second part P2 may be larger than that of the first part P1. The source side channel layer S_CH or the drain side channel layer D_CH including the first parts P1 and the second parts P2 may have a concavo-convex structure. For example, the source side channel layer S_CH or the drain side channel layer D_CH may be thicker at the second parts P2 than at the first parts P1.

The second parts P2 may be surrounded by the conductive patterns CP_S and CP_D. First cell blocking insulating layers BI may be arranged between the second parts P2 and the conductive patterns CP_S and CP_D.

The conductive patterns CP_S and CP_D may not be formed on the first part P1. In addition, the first cell blocking insulating layer BI may not be formed over the first part P1. The first part P1 and the second part P2 may be alternately arranged in the third direction III.

The first cell blocking insulating layer BI may be formed of a material capable of blocking electrical charges. For example, the first cell blocking insulating layer BI may include an oxide layer.

A multiple layer ML may be arranged between the first cell blocking insulating layers BI and the second parts P2. The multiple layer ML may extend along the channel layer CH to surround the first parts P1 and the pipe channel layer P_CH. Because the multiple layer ML is formed along the channel layer CH protruding at the second parts P2, the multiple layer ML may protrude at the second parts P2. The multiple layer ML may include a data storage layer and a tunnel insulating layer. The data storage layer and the tunnel insulating layer may protrude toward the side walls of the first cell blocking insulating layers BI or toward the conductive patterns CP_S and CP_D. The data storage layer is formed in accordance with the shape of the external wall of the channel layer CH and may include a part that is in contact with the first cell blocking insulating layers BI. The tunnel insulating layer may be arranged between the data storage layer and the channel layer CH.

Although not illustrated, a second cell blocking insulating layer may be further formed on side walls of the conductive patterns CP_S and CP_D that are adjacent to the first cell blocking insulating layers BI and top surfaces and bottom surfaces of the conductive patterns CP_S and CP_D. In this case, the second cell blocking insulating layer may be separated by the slit SI, and may have a C-shaped cross-section.

Although not illustrated, the first part P1 may be surrounded by an interlayer insulating layer, and a dummy blocking insulating layer may be further formed between the interlayer insulating layer and the first parts P1.

Detailed structures of the second cell blocking insulating layer, the interlayer insulating layer, and the dummy blocking insulating layer will be described later with reference to FIG. 5B.

In FIG. 1A, source side memory cells may be formed at intersections between the source side channel layer S_CH and the source side word lines WL_S, and drain side memory cells may be formed at intersections between the drain side channel layer D_CH and the drain side word lines WL_D. A source select transistor may be formed at an intersection between the source side channel layer S_CH and the source select line SSL, and a drain select transistor may be formed at an intersection between the drain side channel layer D_CH and the drain select line DSL. A pipe transistor may be formed at an intersection between the pipe channel layer P_CH and the pipe gate PG. The source select transistor, the source side memory cells, the pipe transistor, the drain side memory cells, and the drain select transistor that are arranged along a channel layer CH may be serially connected through the channel layer CH. The source select transistor, the source side memory cells, the pipe transistor, the drain side memory cells, and the drain select transistor that are connected to one another through the channel layer CH may form a U-type cell string UCST. The source side word lines WL_S may carry a signal to gates of the source side memory cells. The drain side word lines WL_D may carry a signal to gates of the drain side memory cells. The source select line SSL may carry a signal to a gate of the source select transistor. The drain select line DSL may carry a signal to a gate of the drain select transistor. The pipe gate PG may carry a signal to a gate of the pipe transistor.

In addition to the U-type cell string UCST discussed above, the channel layer CH may have various shapes such as a W shape. In accordance with the structure of the channel layer CH, the memory cells may be arranged in various ways. Therefore, a memory string may have various shapes.

Referring to FIGS. 1B and 1C, each of the memory blocks may include a straight type cell string SCST. The straight type cell string SCST may include a straight type channel layer CH and conductive patterns CP separately stacked to surround the channel layer CH.

The channel layer CH may be electrically connected to the source layer SL and the bit line BL. The channel layer CH may be formed in a hole that passes through the conductive patterns CP. The channel layer CH is tube-shaped to surround a core insulating layer arranged in a central region of the hole. Alternatively, the channel layer CH may be formed by filling the central region of the hole.

The bit line BL may be electrically connected to an upper end of the channel layer CH, and may extend in the second direction II. The conductive patterns CP may be separated by the slit SI. The conductive patterns CP may include a lower select line LSL, word lines WL, and an upper select line USL, which are sequentially stacked along the channel layer CH. The lower select line LSL may be arranged between the word lines WL and a source line SL. Here, a single lower select line LSL may be arranged between the word lines WL and the source layer SL. Alternatively, two or more lower select lines LSL stacked between the word lines WL and the source layer SL may be provided. The upper select line USL may be arranged between the word lines WL and the bit line BL. Here, a single upper select line USL may be arranged between the word lines WL and the bit line BL. Alternatively, one or more upper select lines USL stacked between the word lines WL and the bit line BL may be provided. One of the upper select line LSL and the upper select line USL may be divided into smaller units than the word lines WL. For example, each of the word lines WL may surround two or more columns of channel layers CH, and the upper select line USL may surround one column of channel layers CH. In this case, the upper select line USL may be separated by an upper slit USI as well as the slit SI, and may be narrower than the word lines WL.

The channel layer CH may extend in the third direction III perpendicular to a plane that extends in the first direction I and the second direction II. The channel layer CH may have a concavo-convex structure. For example, the channel layer CH may be thicker at regions on which conductive patterns CP are formed.

The channel layer CH may include first parts P1 and second parts P2 alternately arranged in the third direction III. Side walls of the second parts P2 may protrude further toward the conductive pattern (e.g., CPs) than side walls of the first part P1. As a result, a width of the second part P2 may be larger than that of the first part P1. The channel layer CH including the first parts P1 and the second parts P2 may have a concavo-convex structure.

The second part P2 may be surrounded by the first cell blocking insulating layer BI. The second part P2 may be surrounded by one of the conductive patterns CP. The first cell blocking insulating layers BI may be respectively arranged between the conductive patterns CP and the second parts P2 corresponding to the conductive patterns CP.

The first cell blocking insulating layer BI may not be formed on the first part P1. The first cell blocking insulating layer BI may not overlap the first cell blocking insulating layer BI. The first part P1 and the second part P2 may be alternately arranged in the third direction III.

The first cell blocking insulating layer BI may be formed of a material capable of blocking electrical charges. For example, the first cell blocking insulating layer BI may include an oxide layer.

A multiple layer ML or ML1 may be arranged between the first cell blocking insulating layers BI and the second parts P2. The multiple layer ML or ML1 may extend along the channel layer CH to surround the first parts P1. Because the multiple layer ML is formed along the channel layer CH protruding at the second parts P2, the multiple layer ML or ML1 may protrude at the second parts P2. The multiple layer ML or ML1 may include a data storage layer and a tunnel insulating layer. The data storage layer and the tunnel insulating layer may protrude toward the side walls of the first cell blocking insulating layers BI or toward the conductive patterns CP. The data storage layer is formed in accordance with the shape of the external wall of the channel layer CH and may include a part that contacts the first cell blocking insulating layers BI. The tunnel insulating layer may be arranged between the data storage layer and the channel layer CH.

Although not illustrated, a second cell blocking insulating layer may be further formed on side walls of the conductive patterns CP that are adjacent to the first cell blocking insulating layers BI and top surfaces and bottom surfaces of the conductive patterns CP. In this case, the second cell blocking insulating layer may be separated by the slit SI and may have a C-shaped cross-section.

Although not illustrated, the first parts P1 may be surrounded by an interlayer insulating layer, and a dummy blocking insulating layer may be further formed between the interlayer insulating layer and the first parts P1.

Detailed structures of the second cell blocking insulating layer, the interlayer insulating layer, and the dummy blocking insulating layer will be described later with reference to FIG. 5B.

As illustrated in FIG. 1B, a top surface of the channel layer CH may be connected to the bit line BL, and a bottom surface of the channel layer CH may be connected to the source layer SL. The channel layer CH may be in contact with a top surface of the source layer SL, and may extend toward the bit line BL. The source layer SL may be a part of a semiconductor substrate into which impurities are implanted or may be a part of a doped silicon layer formed on the semiconductor substrate.

As illustrated in FIG. 1C, the top surface of the channel layer CH may be connected to the bit line BL, and channel layer CH may extend down to the source layer SL. For example, a part of a lower end of the channel layer CH may be formed in the source layer SL. That is, the lower end of the channel layer CH may pass through a part of the source layer SL. The source layer SL may include a first source layer SL1 and a second source layer SL2 formed on the first source layer SL1. The first source layer SL1 may surround the lower end of the channel layer CH. The second source layer SL2 may be in contact with the side wall of the channel layer CH while surrounding the channel layer CH. A lower multiple layer ML2 may be arranged between the channel layer CH and the first source layer SL1. The lower multiple layer ML2 may extend along the channel layer CH. The lower multiple layer ML2 may include the same material layers as the multiple layer ML1. For example, the lower multiple layer ML2 may include a tunnel insulating layer and a data storage layer. The lower multiple layer ML2 may be separate from the multiple layer ML1 through the second source layer SL2.

In FIGS. 1B and 1C, the memory cells may be formed at intersections between the channel layer CH and the word lines WL, the lower select transistor may be formed at an intersection between the channel layer CH and the lower select line LSL, and the upper select transistor may be formed at an intersection between the channel layer CH and the upper select line USL. The lower select transistor, the memory cells, and the upper select transistor that are serially arranged along a channel layer CH may be serially connected through the channel layer CH to define the straight type cell string SCST. The word lines WL may carry a signal to the gates of the memory cells. The lower select line LSL may carry a signal to the gate of the lower select transistor, and the upper select line USL may carry a signal to the gate of the upper select transistor.

The semiconductor devices described with reference to FIGS. 1A to 1C may include a three dimensional cell string structure having the multiple layer ML or ML1. The multiple layer ML or ML1 may include the channel layer CH extending in the third direction III. The channel layer CH may include the first parts P1 and the second parts P2 that are alternately arranged. The multiple layer ML or ML1 may also include the first cell blocking insulating layers BI, which surround the second parts P2 of the channel layer CH, and the data storage layer, which protrudes toward the side walls of the first cell blocking insulating layers BI. According to an embodiment of the present invention, the data storage layer may be formed such that some parts of the data storage layer protrude toward the side walls of the first cell blocking insulating layers BI. In this way, an electric field may be concentrated on one of the conductive patterns CP_S, CP_D, and CP adjacent to the channel layer CH during a program operation, an erase operation, or a read operation of the three dimensional semiconductor memory device and dispersion of the electric field may be reduced.

Hereinafter, a method of manufacturing the semiconductor device including the data storage layer that protrudes toward the side walls of the first cell blocking insulating layers BI will be described.

Figure 2A:
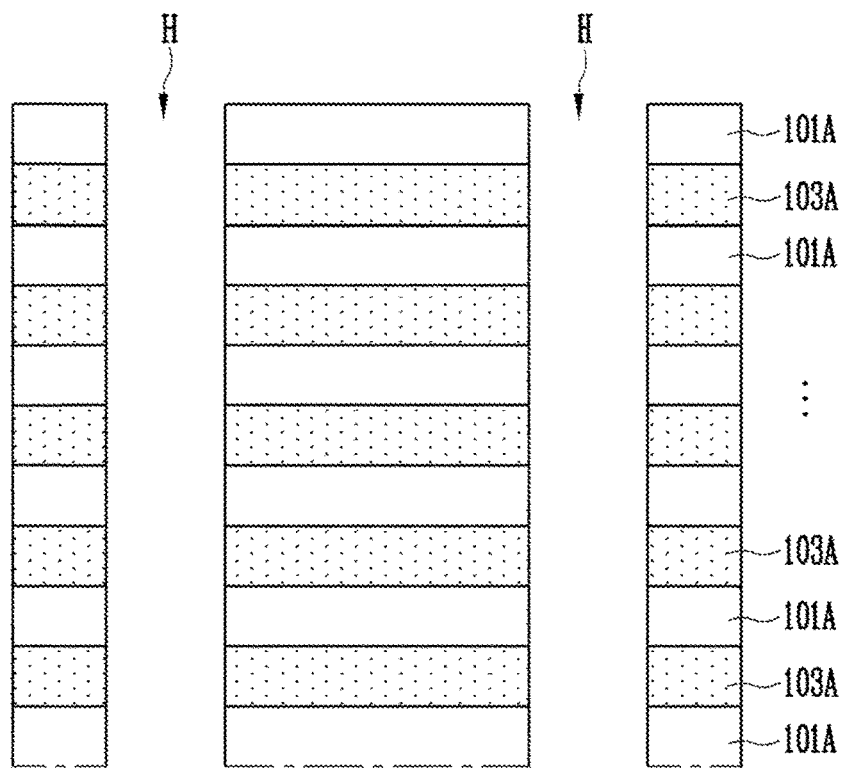
FIGS. 2A to 5B are cross-sectional views illustrating an example method of manufacturing a semiconductor device according to an embodiment of the present invention.
Figure 5A:
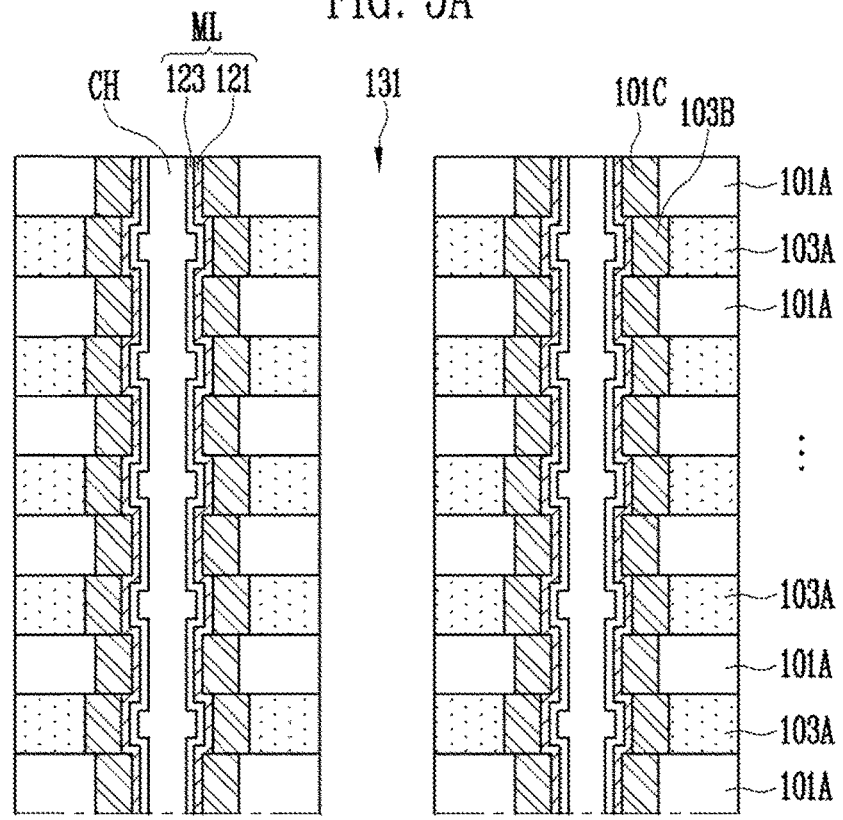
Figure 5B:
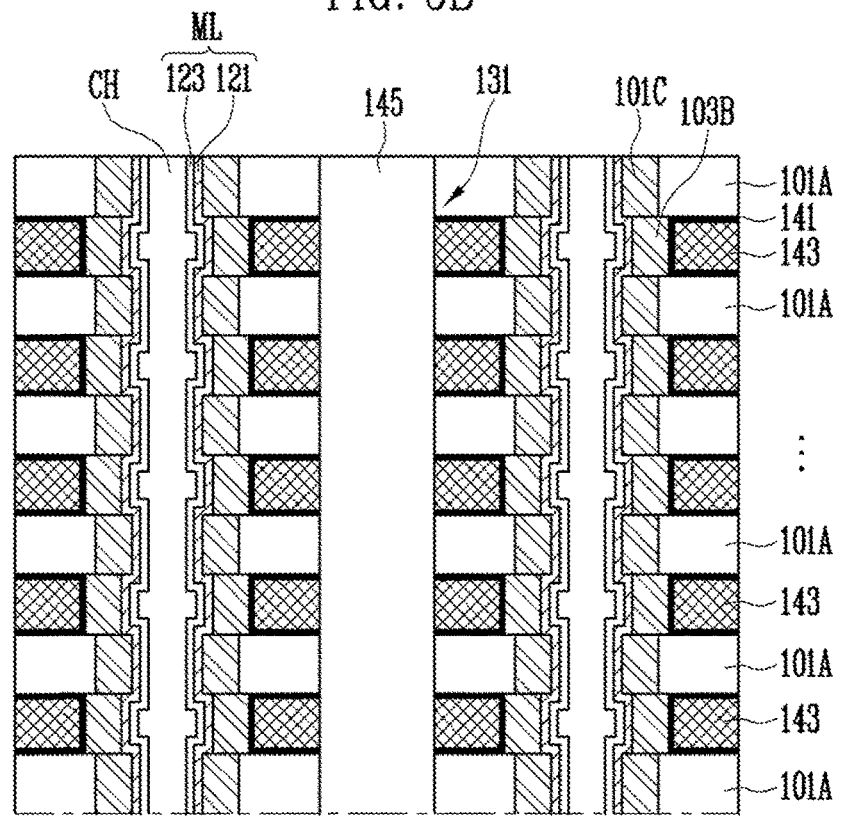

FIGS. 2A and 5B are cross-sectional views illustrating an example method of manufacturing a semiconductor device according to an embodiment of the present invention.

Figure 2B:
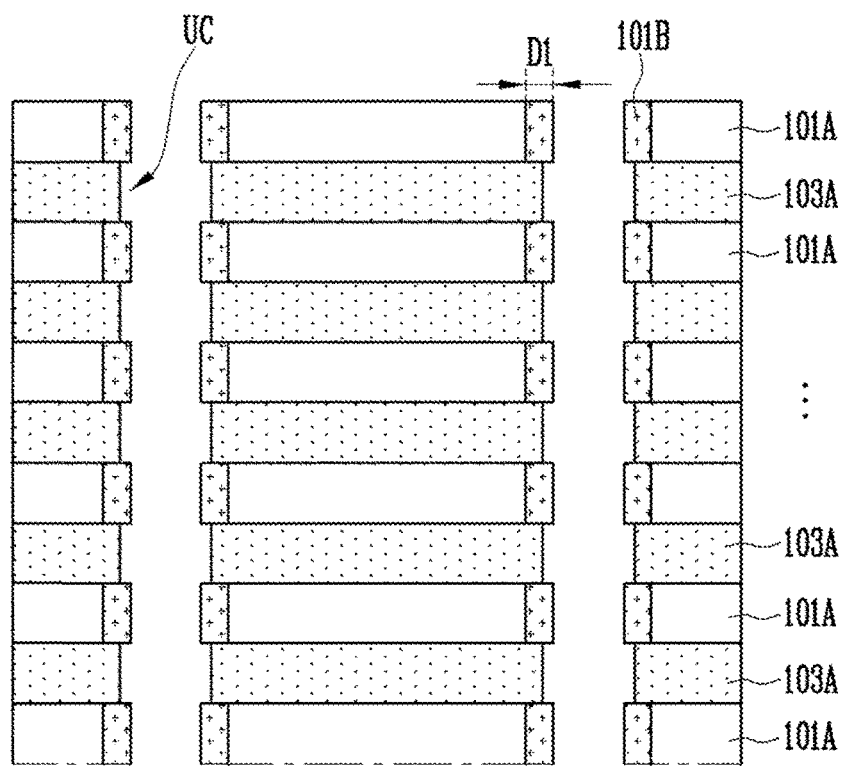

FIGS. 2A and 2B are cross-sectional views illustrating an example process of defining an undercut region in an internal wall of a hole that passes through a stack structure.

Referring to FIG. 2A, the stack structure may be formed by alternately stacking first material layers 101A and second material layers 103A on a lower structure (not illustrated).

The lower structure may vary in accordance with a structure of a cell string to be formed. For example, when the cell string described in FIG. 1A is to be formed, the lower structure may include a pipe gate having a trench filled with a pipe sacrificial layer. When the cell string described in FIG. 1B is to be formed, the lower structure may include a source layer doped with impurities. When the cell string described in FIG. 1C is to be formed, the lower structure may include a stacked structure of a first source layer and a source sacrificial layer.

The first material layers 101A may be formed in regions in which interlayer insulating layers are to be arranged and the second material layers 103A may be formed in regions in which conductive patterns are to be arranged.

The second material layers 103A may be formed of a material different from that of the first material layers 101A. For example, the first material layers 101A may be formed of an insulating material for an interlayer insulating layer, and the second material layers 103A may be formed of a sacrificial insulating material having different etch selectivity with respect to the first material layers 101A. In this case, the first material layers 101A may be formed of an oxide layer such as a silicon oxide layer, and the second material layers 103A may be formed of a nitride layer such as a silicon nitride layer. When all the first and second material layers 101A and 103A are formed of insulating materials, in forming a hole or a slit, etching processes may be performed relatively easily Subsequently, holes H that pass through the stack structure may be formed by etching the first material layers 101A and the second material layers 103A.

Referring to FIG. 2B, third material layers 101B may be formed on side walls of the first material layers 101A by selectively changing a material property of the side walls of the first material layers 101A of the stack structure through the holes H. The third material layers 101B may include a part in which the material property of the first material layers 101A has been changed and a growth part grown from the property-changed part. Therefore, the third material layers 101B may have side walls that protrude further toward centers of the holes H than side walls of the second material layers 103A. The third material layers 101B may have the same material property as the second material layers 103A.

The third material layers 101B may be formed by selectively nitrifying only the first material layers 101A formed of the silicon oxide layer. A process of selectively nitrifying the first material layers 101A may be performed by a plasma pyrolysis process or a thermal pyrolysis process in which a nitrification gas is used. The nitrification gas may include nitrogen. For example, the nitrification gas may include at least one of $NH_3$, $N_2$, $N_2O$, and NO gases. Nitrogen atoms of the nitrification gas are radicalized by the plasma pyrolysis process or the thermal pyrolysis process so that the first material layers 101A may be nitrified. As a result, the third material layers 101B of $Si_3N_4$ may be generated. The nitrification gas may further include at least one of $H_2$, Ar, and He.

The side walls of the third material layers 101B may protrude further than the side walls of the second material layers 103A by the nitrification process. Therefore, undercut regions UC may be defined in internal walls of the holes H. The third material layers 101B may have a first thickness D1.

Figure 3:
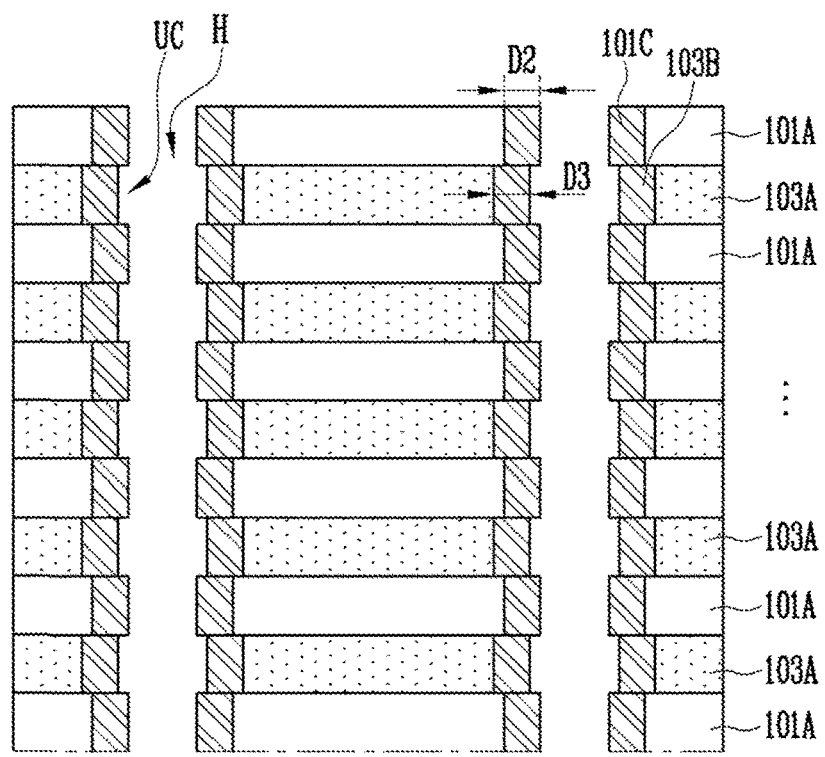

FIG. 3 is a cross-sectional view illustrating an example process of forming first cell blocking insulating layers 103B so that undercut regions may remain.

Referring to FIG. 3, dummy blocking insulating layers 101C arranged on the side walls of the first material layers 101A and the first cell blocking insulating layers 103B arranged on the side walls of the second material layers 103A may be formed. The dummy blocking insulating layers 101C and the first cell blocking insulating layers 103B may be simultaneously formed by an oxidization process.

The dummy blocking insulating layers 101C may include parts in which the third material layers (101B of FIG. 5B) are oxidized and growth parts grown from the oxidized parts of the third material layers 101B, and may have a second thickness D2. The first cell blocking insulating layers 103B may include parts in which the side walls of the second material layers 103A are oxidized and growth parts grown from the oxidized parts of the side walls of the second material layers 103A, and may have a third thickness D3. When the third material layers 101B have the same material property as that of the second material layers 103A, thicknesses of the oxidized parts of the second material layers 103A and the third material layers 101B may be similarly controlled and thicknesses of the parts grown from the oxidized parts of the second material layers 103A and the third material layers 101B may be similarly controlled. That is, the second thickness D2 and the third thickness D3 may be similarly controlled. Therefore, side walls of the dummy blocking insulating layers 101C may protrude further toward the center of the holes H than side walls of the first cell blocking insulating layers 103B. As a result, the undercut regions UC described with reference to FIG. 2B may remain after the oxidization process, and may be defined to have a concavo-convex structure by the dummy blocking insulating layers 101C and the first cell blocking insulating layers 103B.

Figure 4:
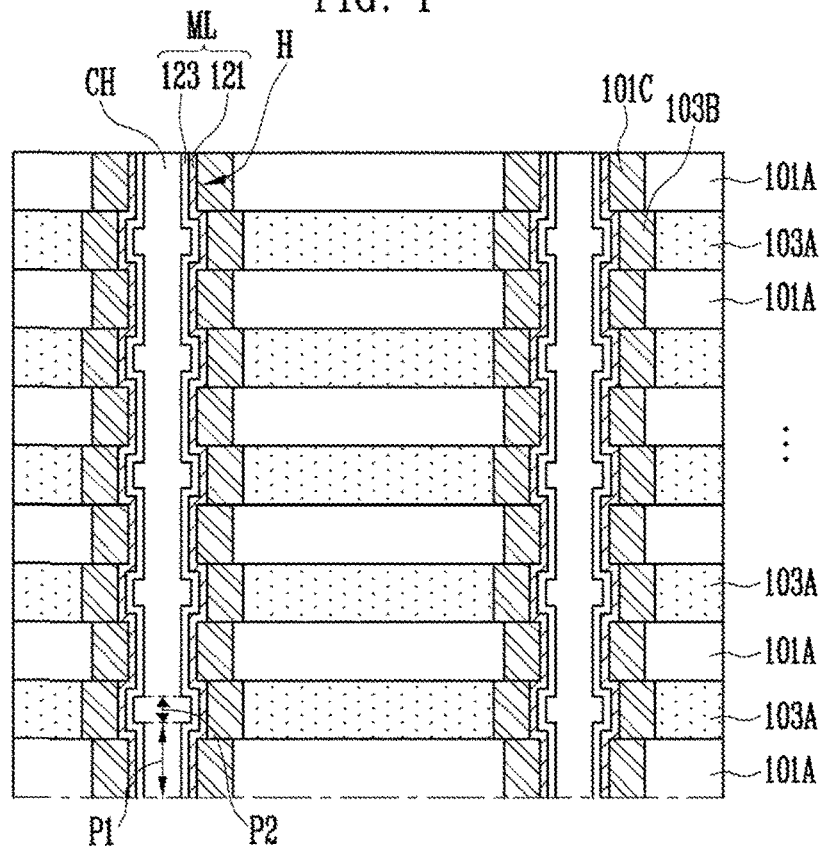

FIG. 4 is a cross-sectional view illustrating an example process of forming a multiple layer and a channel layer having concavo-convex structures.

Referring to FIG. 4, a multiple layer ML is formed on the internal walls of the holes H having the concavo-convex structure by the undercut regions. A process of forming the multiple layer ML may include forming a data storage layer 121 along the side walls of the first cell blocking insulating layers 103B and the dummy blocking insulating layers 101C and forming a tunnel insulating layer 123 on the data storage layer 121. The tunnel insulating layer 123 may be formed of a silicon oxide layer and the data storage layer 121 may be formed of a silicon nitride layer capable of trapping charges.

Subsequently, the channel layer CH may be formed on the multiple layer ML. The channel layer CH may have various structures. The structure of the channel layer CH will be described with reference to FIGS. 6A and 6B.

The channel layer CH may include the first parts P1 and the second parts P2 alternately arranged in a direction in which the first material layers 101A and the second material layers 103A are stacked. The first parts P1 may be surrounded by the first material layers 101A defined as interlayer insulating layers. The first material layers 101A defined as interlayer insulating layers may be parts of the first material layers 101A that remain without being changed by the nitrification process described with reference to FIG. 2B and the oxidation process described with reference to FIG. 3. The first parts P1 may be surrounded by the dummy blocking insulating layers 101C. Each of the first material layers 101A defined as the interlayer insulating layers may surround one of the first parts P1 with one of the dummy blocking insulating layers 101C interposed. That is, the first material layers 101A defined as the interlayer insulating layers may surround the dummy blocking insulating layers 101C.

The second parts P2 may extend toward insides of the undercut regions. Therefore, side walls of the second parts P2 may protrude further toward the data storage layer 121 than side walls of the first parts P1 and a width of each of the second parts P2 may be larger than that of each of the first parts P1. Therefore, the channel layer CH may have protrusions at portions adjacent to the first cell blocking insulating layers 103B.

According to an embodiment of the present invention, the side walls of the dummy blocking insulating layers 101C may protrude further toward the data storage layer 121, the tunnel insulating layer 123, or the channel layer CH than the side walls of the first cell blocking insulating layers 103B.

FIGS. 5A and 5B are cross-sectional views illustrating an example process of forming a conductive pattern between adjacent interlayer insulating layers.

Referring to FIG. 5A, the first material layers 101A and the second material layers 103A may be etched so that a slit 131 passing through the first material layers 101A and the second material layers 103A is formed between the channel layers CH.

Referring to FIG. 5B, the second material layers (e.g., 103A of FIG. 5A) may be replaced by conductive patterns 143 through the slit 131. Hereinafter, a process of replacing the second material layers 103A by the conductive patterns 143 will be described in more detail.

First, the second material layers 103A may be selectively removed through the slit 131. At this time, the first cell blocking insulating layers 103B having a material property different from that of the second material layers 103A may function as etching stop layers. Therefore, it is possible to prevent the data storage layer 121 from being damaged by a process of removing the second material layers 103A through the first cell blocking insulating layers 103B. By removing the second material layers 103A, openings exposing the first cell blocking insulating layers 103B may be formed.

Subsequently, second cell blocking insulating layers 141 may be further formed along surfaces of the openings. The second cell blocking insulating layers 141 may be formed in order to reinforce a charge blocking function of the first cell blocking insulating layers 103B. The second cell blocking insulating layers 141 may be formed of a silicon oxide layer. A process of forming the second cell blocking insulating layers 141 may be omitted.

Subsequently, the openings may be filled with the conductive patterns 143. The conductive patterns 143 may be separated by the slit 131. After forming the conductive patterns 143, the slit 131 may be filled with a slit insulating layer 145.

The first material layers 101A remaining as the interlayer insulating layers and the conductive patterns 143 may be alternately stacked, and memory cells and select transistors may be formed at intersections between the conductive patterns 143 and the channel layer CH by the above-described process.

Figure 6A:
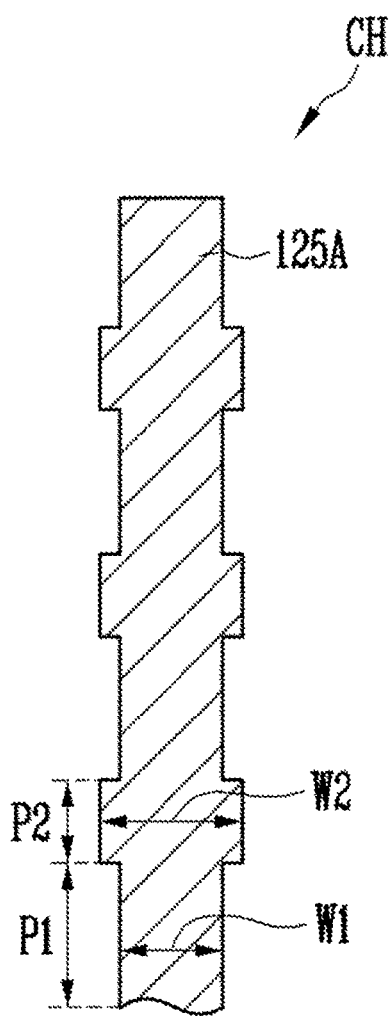
FIGS. 6A and 6B are cross-sectional views illustrating a partial region of an upper end of a channel layer according to an embodiment of the present invention.
Figure 6B:
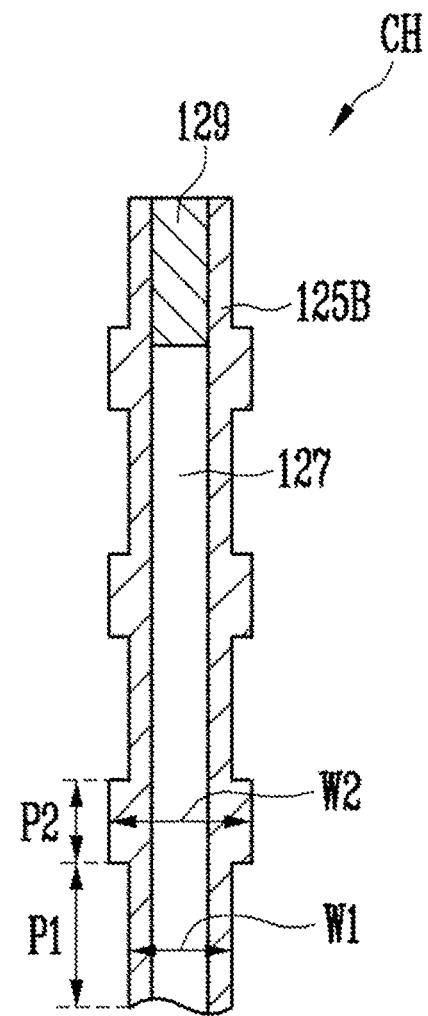

FIGS. 6A and 6B are cross-sectional views illustrating a partial region of an upper end of a channel layer according to embodiments of the present invention.

Referring to FIGS. 6A and 6B, the channel layer CH according to embodiments of the present invention may include a first part P1 and a second part P2 alternately arranged in a direction in which the channel layer CH extends. A width W2 of the second part P2 may be larger than a width W1 of the first part P1.

As illustrated in FIG. 6A, the channel layer CH may include a semiconductor layer 125A filling a space from a surface of the channel layer CH to a central region of the channel layer CH.

As illustrated in FIG. 6B, the channel layer CH may include a semiconductor layer 125B and a core insulating layer 127. The semiconductor layer 125B may be formed along the surface of the channel layer CH, and thus may have a tube shape. The core insulating layer 127 filling a central region of the tube-shaped semiconductor layer 125B. A height of the core insulating layer 127 may be smaller than that of the tube-shaped semiconductor layer 125B. A capping conductive layer 129 may be further formed on the core insulating layer 127. The capping conductive layer 129 may fill a space from an upper end of the tube-shaped semiconductor layer 125B to the central region of the tube-shaped semiconductor layer 125B.

The semiconductor layers 125A and 125B may be undoped silicon layers or doped silicon layers. The capping conductive layer 129 may be a doped silicon layer including impurities of a higher concentration than that of the tube-shaped semiconductor layer 125B. The capping conductive layer 129 may be used as a junction region of a transistor.

Figure 7A:
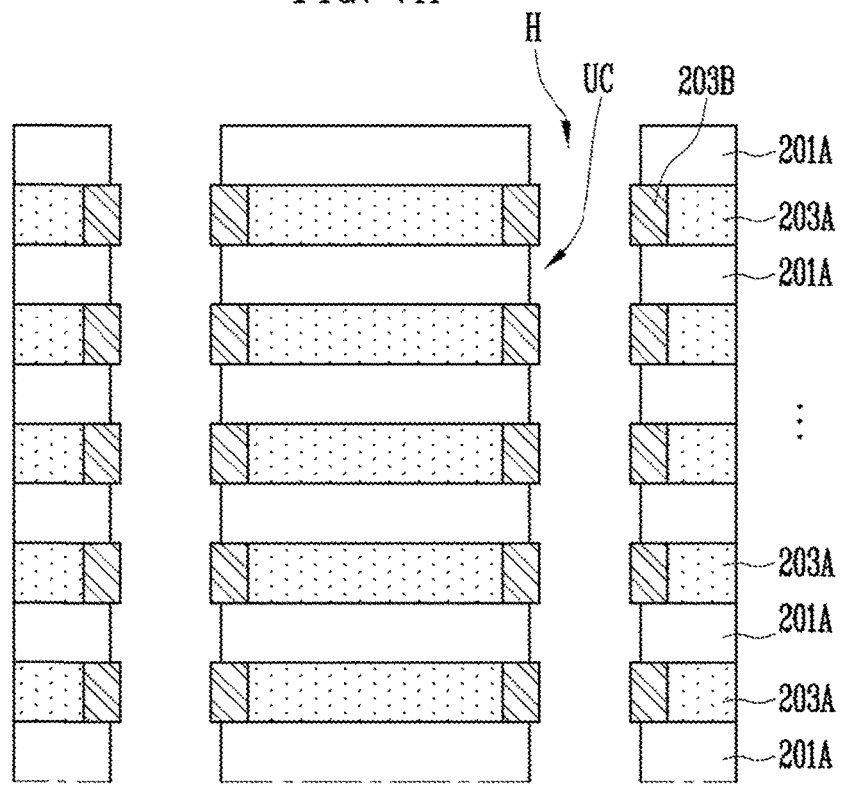
FIGS. 7A and 7B are cross-sectional views illustrating example methods of manufacturing a semiconductor device.
Figure 7B:
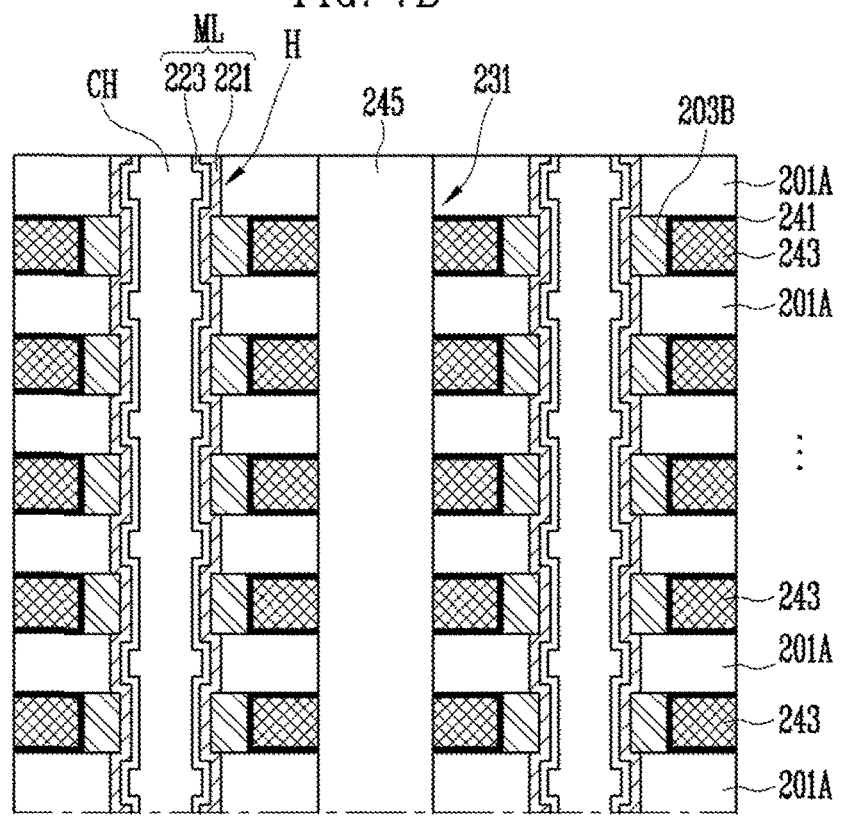

FIGS. 7A and 7B are cross-sectional views illustrating an example of a semiconductor device and an example method of manufacturing the same.

Referring to FIG. 7A, as illustrated in FIG. 2A, after alternately stacking first material layers 201A and second material layers 203A, holes H passing through the first material layers 201A and the second material layers 203A are formed.

Subsequently, without performing the process described with reference to FIG. 2B, an oxidation process may be performed so that first cell blocking insulating layers 203B may be formed on side walls of the second material layers 203A. In this case, the first cell blocking insulating layers 203B may protrude further toward insides of the holes H than the first material layers 201A. Therefore, the undercut regions UC may be defined on the side walls of the first material layers 201A unlike in FIG. 3.

Referring to FIG. 7B, a data storage layer 221 and a tunnel insulating layer 223 are formed on the surfaces of the holes H having a concavo-convex structure including the undercut regions UC. Therefore, a multiple layer ML is formed. Then, the channel layer CH is formed on the multiple layer ML.

Subsequently, a slit 231 passing through the first material layers 201A and the second material layers (e.g., 203A of FIG. 7A) may be formed, and the second material layers 203A may be replaced by conductive patterns 243 through the slit 231. After removing the second material layers 203A, before forming the conductive patterns 243, second cell blocking insulating layers 241 may be further formed along surfaces of regions from which the second material layers 203A are removed.

Subsequently, the slit 231 may be filled with a slit insulating layer 245.

According to the above described example, the data storage layer 221 may protrude toward the first material layers 201A for interlayer insulating layers arranged on and under the conductive patterns 243. According to embodiments of the present invention, the data storage layer protrudes toward the conductive patterns, so that, during the operation of the semiconductor device, the electric field may be concentrated on central regions of cells connected to the conductive patterns.

Figure 8:
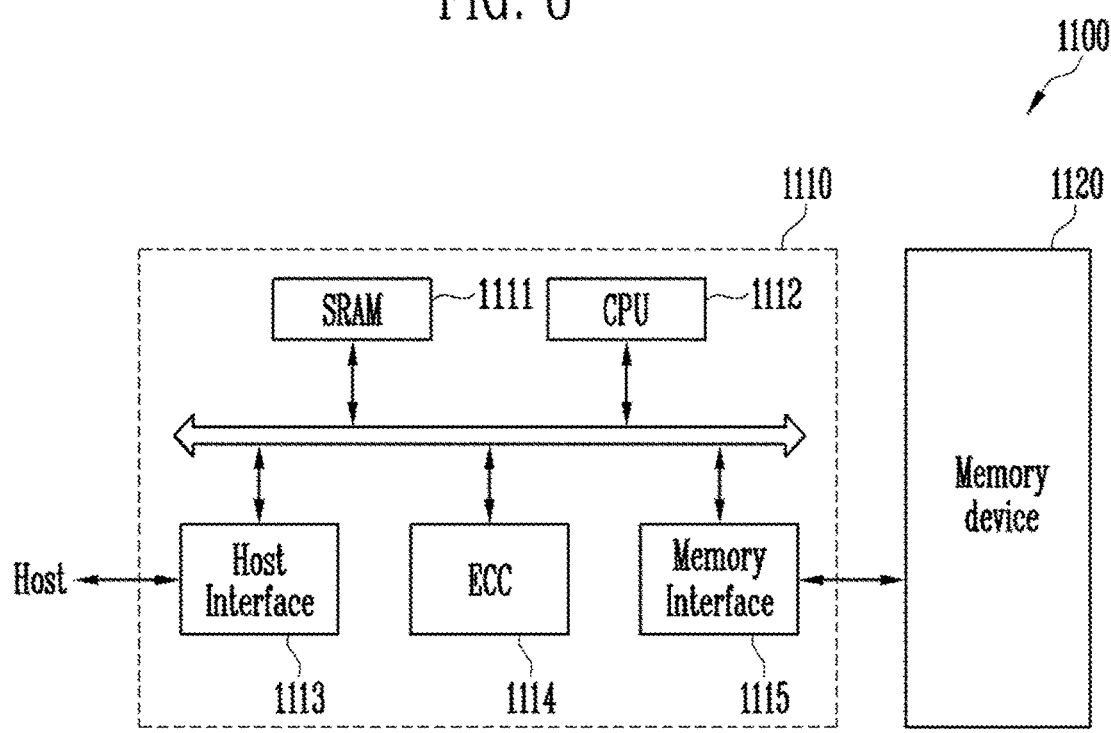
FIG. 8 is a diagram illustrating an example configuration of a memory system according to an embodiment of the present invention.

FIG. 8 is a diagram illustrating an example configuration of a memory system 1100 according to an embodiment of the present invention.

Referring to FIG. 8, the memory system 1100 may include a memory device 1120 and a memory controller 1110.

The memory device 1120 may include the structure described with reference to FIGS. 1A, 1B, 1C, 5B, 6A, and 6B and may be formed by using the process described with reference to FIGS. 2A to 5B. More specifically, the memory device 1120 may include a concavo-convex data storage layer. The concavo-convex data storage layer may include a first side wall protruding toward the interlayer insulating layers and a second side wall protruding toward the conductive patterns. The second side wall of the concavo-convex data storage layer may protrude further toward side parts of the conductive patterns than the first side wall of the concavo-convex data storage layer. In addition, the memory device 1120 may include a cell blocking insulating layer that surrounds the second side wall of the data storage layer and does not overlap the first side wall of the data storage layer.

The memory device 1120 may be a multi-chip package formed of a plurality of flash memory chips.

The memory controller 1110 may control the memory device 1120, and may include a static random access memory (SRAM) 1111, a central processing unit (CPU) 1112, a host interface 1113, an error correction code (ECC) 1114, and a memory interface 1115. The SRAM 1111 may be used as an operation memory. The CPU 1112 may perform an entire control operation for exchanging data of the memory controller 1110. The host interface 1113 may include a data exchange protocol of a host connected to the memory system 1100. In addition, the ECC 1114 may detect and corrects errors included in data read from the memory device 1120, and the memory interface 1115 may interface with the memory device 1120. The memory controller 1110 may further include a read only memory (ROM) for storing code data for interfacing with the host.

The above-described memory system 1100 may be a memory card or a solid state disk (SSD) in which the memory device 1120 and the controller 1110 are combined with each other. For example, when the memory system 1100 is the SSD, the memory controller 1110 may communicate with an external device (e.g., the host) through one of various interface protocols such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and an integrated drive electronics (IDE).

Figure 9:
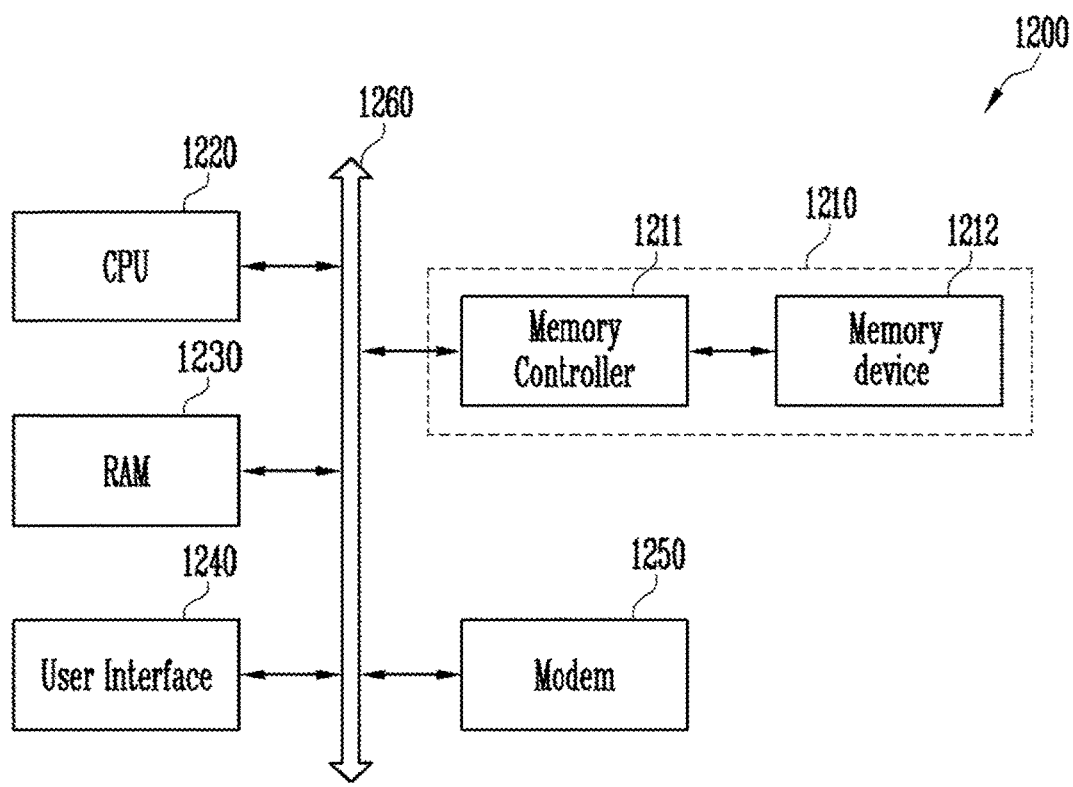
FIG. 9 is a diagram illustrating an example configuration of a computing system according to an embodiment of the present invention.

FIG. 9 is a diagram illustrating an example configuration of a computing system 1200 according to an embodiment of the present invention.

Referring to FIG. 9, the computing system 1200 may include a CPU 1220 electrically connected to a system bus 1260, a RAM 1230, a user interface 1240, a MODEM 125, and a memory system 1210. In addition, when the computing system 1200 is a mobile device, a battery for supplying an operation voltage to the computing system 1200 may be further included, and an application chipset, a camera image processor (CIS), and a mobile DRAM may be further included.

As illustrated with reference to FIG. 8, the memory system 1210 may include a memory device 1212 and a memory controller 1211.

According to an embodiment of the present invention, the data storage layer may protrude toward the side walls of the conductive patterns so that the electric field is concentrated on the intersections between the channel layer and the conductive patterns of the three dimensional semiconductor memory device and dispersion of the electric field may be reduced. As a result, according to an embodiment of the present invention, it is possible to minimize movement of charges between adjacent cells in a direction in which the channel layer extends, and it is possible to improve operation reliability of the three dimensional semiconductor memory device by improving a distribution of threshold voltages of cells.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   alternately stacking first material layers and second material layers;
   forming a hole passing through the first material layers and the second material layers;
   forming cell blocking insulating layers arranged on side walls of the second material layers and dummy blocking insulating layers arranged on side walls of the first material layers, the dummy blocking insulating layers having side walls protruding further toward the hole than the cell blocking insulating layers; and
   forming a data storage layer along the side walls of the cell blocking insulating layers and the dummy blocking insulating layers,
   wherein forming the cell blocking insulating layers and the dummy blocking insulating layers comprises:
      forming third material layers having side walls protruding further toward the hole than the side walls of the second material layers on the side walls of the first material layers; and
      oxidizing the third material layers and portions of the side walls of the second material layers.

2. The method of claim 1, wherein the third material layers have the same material property as the second material layers.

3. The method of claim 1, wherein forming the third material layers comprises selectively nitrifying the first material layers through the hole.

4. The method of claim 3, wherein a nitride is grown during a step of selectively nitrifying the first material layers.

5. The method of claim 4, wherein selectively nitrifying the first material layers is performed by a plasma pyrolysis process or a thermal pyrolysis process in which a nitrification gas including at least one of a group consisting of $NH_3$, $N_2$, $N_2O$, and NO gases is used.

6. The method of claim 5, wherein the nitrification gas further comprises at least one of a group consisting of $H_2$, Ar, and He.

7. The method of claim 1, wherein the first material layers are formed of an oxide layer, and the second material layers are formed of a nitride layer.

8. The method of claim 1, further comprising:
   forming a tunnel insulating layer on the data storage layer; and
   forming a channel layer on the tunnel insulating layer.

9. The method of claim 8, wherein the tunnel insulating layer is formed along the side walls of the cell blocking insulating layers and the dummy blocking insulating layers.

10. The method of claim 8, wherein the channel layer has a side wall protruding further toward the cell blocking insulating layers than the dummy blocking insulating layers.

11. The method of claim 1, further comprising:
    forming a slit passing through the first material layers and the second material layers;
    removing the second material layers through the slit to expose the cell blocking insulating layers and the dummy blocking insulating layers; and
    filling regions from which the second material layers are removed with conductive patterns.

* * * * *